(12) United States Patent
Saimen

(10) Patent No.: US 7,704,793 B2
(45) Date of Patent: Apr. 27, 2010

(54) ELECTRONIC PART AND METHOD FOR MANUFACTURING THE SAME

(75) Inventor: Munehide Saimen, Sakata (JP)

(73) Assignee: Seiko Epson Corporation (JP)

( * ) Notice: Subject to any disclaimer, the term of this patent is extended or adjusted under 35 U.S.C. 154(b) by 107 days.

(21) Appl. No.: 12/011,918

(22) Filed: Jan. 30, 2008

(65) Prior Publication Data

US 2008/0132001 A1 Jun. 5, 2008

Related U.S. Application Data

(62) Division of application No. 11/247,610, filed on Oct. 10, 2005, now Pat. No. 7,348,679.

(30) Foreign Application Priority Data

Nov. 24, 2004 (JP) .............................. 2004-339305

(51) Int. Cl.
*H01L 21/00* (2006.01)
(52) U.S. Cl. ................ 438/111; 257/E23.055
(58) Field of Classification Search ........... 438/111, 438/110, 464, 461; 257/E23.055; 174/254, 174/261, 255
See application file for complete search history.

(56) References Cited

U.S. PATENT DOCUMENTS

| | | | |
|---|---|---|---|
| 4,304,450 A | 12/1981 | Bilsback et al. | |
| 6,121,880 A | 9/2000 | Scott et al. | |
| 6,313,526 B1 * | 11/2001 | Nakamura | 257/706 |
| 6,433,414 B2 | 8/2002 | Saito | |
| 6,555,755 B1 | 4/2003 | Yanagisawa | |
| 2001/0011763 A1 | 8/2001 | Ushijima et al. | |
| 2005/0121779 A1 | 6/2005 | Saimen | |
| 2005/0168339 A1 | 8/2005 | Arai et al. | |
| 2005/0186702 A1 | 8/2005 | Saimen | |
| 2005/0194693 A1 | 9/2005 | Saimen | |
| 2006/0102382 A1 | 5/2006 | Saimen | |

OTHER PUBLICATIONS

Communication from the Japanese Patent Office regarding corresponding application.

\* cited by examiner

*Primary Examiner*—David A Zarneke
*Assistant Examiner*—Jenny L Wagner
(74) *Attorney, Agent, or Firm*—Harness, Dickey & Pierce, P.L.C.

(57) ABSTRACT

A method for manufacturing an electronic part, including: cutting a wiring substrate, which contains a base substrate, a wiring pattern provided on a first surface of the base substrate, and a reinforcing member provided on a second surface of the base substrate, along a line intersecting with an outer circumference of the reinforcing member; wherein a wire, out of a plurality of wires composing the wiring pattern, arranged closest to an intersecting point of the outer circumference of the reinforcing member and the line has a widest width.

3 Claims, 10 Drawing Sheets (A)

(B)

ELECTRONIC PART AND METHOD FOR MANUFACTURING THE SAME

CROSS REFERENCE TO RELATED APPLICATIONS

This application is a divisional patent application of U.S. Ser. No. 11/247,610 filed Oct. 10, 2005, claiming priority to Japanese Patent Application No. 2004-339305 filed Nov. 24, 2004, all of which are incorporated by reference.

BACKGROUND OF THE INVENTION

1. Technical Field

The present invention relates to an electronic part and a method for manufacturing the same.

2. Related Art

A wiring substrate using a film substrate is known. In order to enable insertion of a portion of the wiring substrate into a connector or the like, there is a case in which a reinforcing board is partially provided on this wiring substrate. As a method for forming such a wiring substrate, it is known to first provide the reinforcing board on a base substrate and then to cut the base substrate together with the reinforcing board.

Now, because the reinforcing board is partially provided on the base substrate, it is necessary to cut a portion having different thicknesses when cutting the base substrate together with the reinforcing board. When cutting the base substrate having the portion with different thicknesses, cracks may occur in the base substrate. In order to provide a highly reliable wiring substrate, it is desirable to prevent the reliability from decreasing due to the cracks. Further, by limiting cutting directions, it becomes possible to manufacture the highly reliable wiring board.

Japanese Unexamined Patent Publication No. 2000-286309 is an example of related art.

SUMMARY

An advantage of the present invention is to provide a highly reliable electronic part and a method for manufacturing the same.

(1) According to a first aspect of the invention, a method for manufacturing an electronic part of the invention includes: cutting a wiring substrate, which contains a base substrate, a wiring pattern provided on a first surface of the base substrate, and a reinforcing member provided on a second surface of the base substrate, along a line intersecting with an outer circumference of the reinforcing member; wherein a wire, out of a plurality of wires composing the wiring pattern, arranged closest to an intersecting point of the outer circumference of the reinforcing member and the line has a widest width. According to the invention, it is possible to prevent the wiring pattern from breakage when cutting the wiring substrate and to manufacture the highly reliable electronic part.

(2) According to a second aspect of the invention, a method for manufacturing an electronic part of the invention includes: cutting a wiring substrate, which contains a base substrate, a wiring pattern provided on a first surface of the base substrate, and a reinforcing member provided on a second surface of the base substrate, along a line intersecting with an outer circumference of the reinforcing member; wherein a wire, out of a plurality of wires composing the wiring pattern, arranged closest to an intersecting point of the outer circumference of the reinforcing member and the line is a wire diverged from a wire that passes through a region overlapping with the reinforcing member. According to the invention, it is possible to manufacture the electronic part in a manner that the reliability does not decrease even when the cracks occur in the wiring substrate when it is being cut.

(3) According to a third aspect of the invention, a method for manufacturing an electronic part of the invention includes: cutting a wiring substrate, which contains a base substrate, a wiring pattern provided on a first surface of the base substrate, and a reinforcing member provided on a second surface of the base substrate member and which has a semiconductor chip mounted thereon, along a line intersecting with an outer circumference of the reinforcing; wherein a wire, out of a plurality of wires composing the wiring pattern, arranged closest to an intersecting point of the outer circumference of the reinforcing member and the line is a wire not electrically connected to the semiconductor chip. According to the invention, it is possible to manufacture the electronic part in a manner that the reliability does not decrease even when the cracks occur in the wiring substrate when it is being cut.

(4) In the first aspect of the invention, a distance from the intersecting point to the wiring pattern may be greater than a total thickness of the base substrate and the reinforcing member. Accordingly, because it is possible to prevent breakage of the wiring pattern when cutting the wiring substrate, the highly reliable electronic part can be manufactured.

(5) In the first aspect of the invention, the process of cutting the wiring substrate may include pressing a region surrounded by sides of the reinforcing member intersecting with the lines and the lines from a side of the second surface.

(6) According to a fourth aspect of the invention, an electronic part includes: a base substrate having a crack; a wiring pattern provided on a first surface of the base substrate; and a reinforcing member provided on a second surface of the base substrate; wherein the wiring pattern includes a plurality of wires passing through a region overlapping with the reinforcing member; and wherein an outermost wire of the wires is a wire having a widest width. According to the invention, the highly reliable electronic part can be provided, with which it is possible to prevent the reliability from decreasing due to the cracks.

(7) According to a fifth aspect of the invention, an electronic part includes: a base substrate having a crack; a wiring pattern provided on a first surface of the base substrate; and a reinforcing member provided on a second surface of the base substrate; wherein the wiring pattern includes a plurality of wires passing through a region overlapping with the reinforcing member; and wherein an outermost wire of the wires is a wire diverged from the rest of the wires. According to the invention, the highly reliable electronic part can be provided, with which it is possible to prevent the reliability from decreasing due to the cracks.

(8) According to a sixth aspect of the invention, an electronic part includes: a wiring substrate having a base substrate having a crack, a wiring pattern provided on a first surface of the base substrate, and a reinforcing member provided on a second surface of the base substrate; a semiconductor chip mounted on the wiring substrate; and a plurality of wires passing through a region overlapping with the reinforcing member; wherein an outermost wire of the wires is a wire not electrically connected to the semiconductor chip. According to the invention, the highly reliable electronic part can be provided, with which it is possible to prevent the reliability from decreasing due to the cracks.

BRIEF DESCRIPTION OF THE DRAWINGS

The invention will be described with reference to the accompanying drawings, wherein like numbers refer to like elements and wherein.

DESCRIPTION OF THE EMBODIMENTS

Embodiments applying the invention will now be described with reference to the drawings. It is to be noted that the invention is not limited to the following embodiments. Further, the embodiments of the invention are to include arrangements of the elements in any of the embodiments and modified examples.

First Embodiment

FIGS. 1 to 8 are diagrams to explain the method for manufacturing the electronic part of the first embodiment applying the invention.

Figure 1:
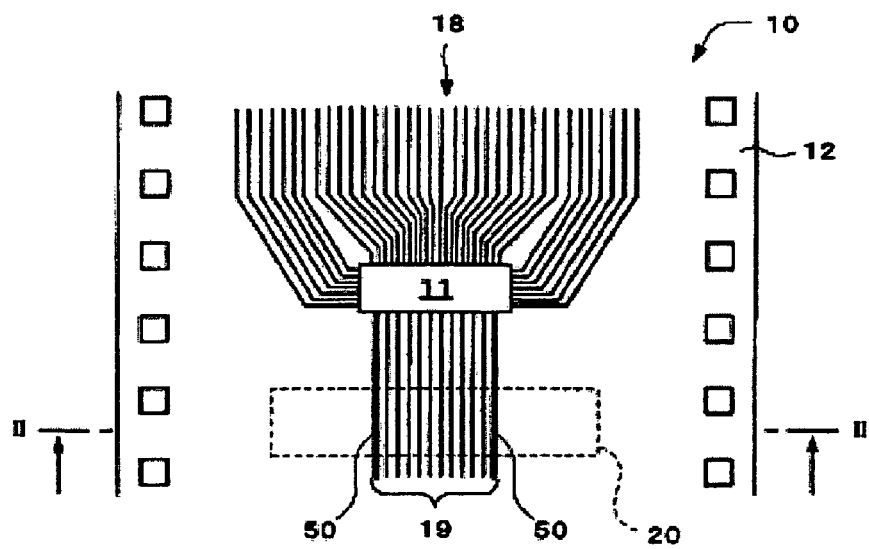
FIG. 1 is a diagram to explain a method for manufacturing an electronic part of a first embodiment applying the invention.
Figure 2:
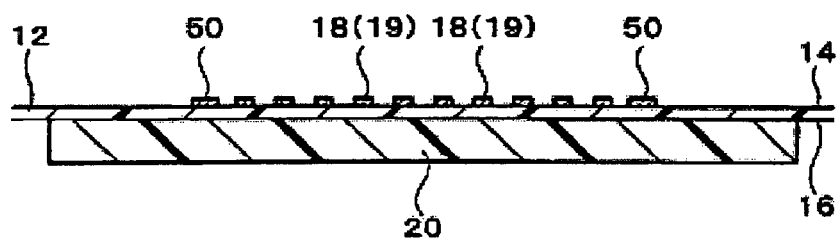
FIG. 2 is a diagram to explain the method for manufacturing the electronic part of the first embodiment applying the invention.
Figure 3:
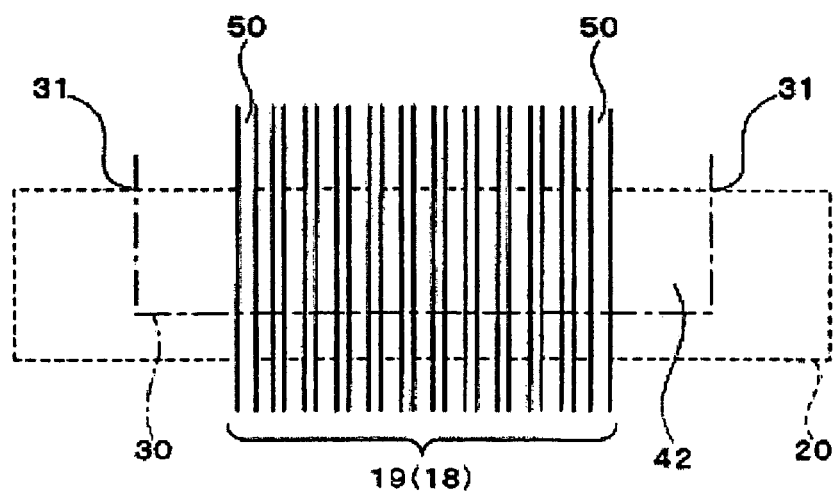
FIG. 3 is a diagram to explain the method for manufacturing the electronic part of the first embodiment applying the invention.

The method for manufacturing the electronic part of the present embodiment may include preparing a wiring substrate 10. Hereinafter, a structure of the wiring substrate 10 will be described. FIGS. 1 to 3 are diagrams to explain the wiring substrate 10. Here, FIG. 1 is a diagram showing an entire configuration of the wiring substrate 10. FIG. 2 is a partially enlarged diagram of FIG. 1 taken across a line II-II. Further, FIG. 3 is a partially enlarged diagram of FIG. 1.

The wiring substrate 10 includes a base substrate 12 (see FIGS. 1 and 2.) The material and structure of the base substrate 12 are not limited to any particular material and structure, and any known substrate may be used. The base substrate 12 may be a flexible substrate or a rigid substrate. The base substrate 12 may be a tape substrate. The base substrate 12 may be a multilayered substrate or a single-layered substrate. Also, the outer configuration of the base substrate 12 is not limited to any particular configuration, either. The material of the base substrate 12 may be organic or inorganic or a compound thereof. As the base substrate 12, either a board or film composed of polyethylene telephthalate (PET), for example, may be used. Alternatively, a flexible substrate composed of polyimide resin may be used as the base substrate 12. As the flexible substrate, tape utilized in a flexible printed circuit (FPC) or a tape-automated-bonding (TAB) technique may be used. The base substrate 12 includes a first surface 14 and a second surface 16, which is on the opposite side of the first surface 14 (see FIG. 2.) Additionally, FIG. 1 is a diagram of the wiring substrate 10 observed from the side of the first surface 14.

The wiring substrate 10 includes a wiring pattern 18 (see FIGS. 1 to 3). The wiring pattern 18 is provided on the first surface 14 of the base substrate 12. The wiring pattern 18 may be provided only on a right surface (the first surface 14) of the base substrate 12. However, if the multilayered substrate is used as the base substrate 12, the wiring substrate 10 may further include wires provided inside the base substrate 12 (not shown). If the tape substrate is used as the base substrate 12, a plurality of wiring patterns 18 may be provided on one base substrate 12 (not shown). The structure and material of the wiring pattern 18 are not limited to any particular structure and material, and any wiring known in the art may be used. For example, the wiring pattern 18 may be formed as a multilayer or a single layer of any of copper (Cu), chromium (Cr), titanium (Ti), nickel (Ni), titanium tungsten (Ti—W), gold (Au), aluminum (Al), nickel vanadium (NiV), and tungsten (W). The wiring pattern 18 may be adhered to the base substrate 12 using an adhesive or the like. Alternatively, the wiring pattern 18 may be provided directly on the first surface 14 of the base substrate 12 (see FIG. 2). The wiring pattern 18 may include a plurality of wires 19 that pass through a region overlapping with a reinforcing member 20 (see FIG. 1) which will be described hereinafter. Further, of the plurality of wires composing the wiring pattern 18, wires 50, which will be described hereinafter, arranged closest to intersecting points 31 of an outer circumference of the reinforcing member 20 and a line 30 are wires having the largest width as shown in FIGS. 1 and 3.

The wiring substrate 10 includes the reinforcing member 20 (see FIGS. 1 to 3). The reinforcing member 20 is provided on the second surface 16 of the base substrate 12. The reinforcing member 20 is a member that enables insertion of a terminal portion 48 of an electronic part (an electronic part 2), which is formed by die-cutting a portion of the wiring substrate 10, into a connector. By adding thickness to the base substrate 12 with the reinforcing member 20, the terminal portion does not easily bend, and, thereby, it becomes possible to insert the terminal portion into the connector. The reinforcing member 20 may be crimped to the base substrate 12 by, for example, pressing the reinforcing member 20 to the base substrate 12. Alternatively, the reinforcing member 20 may be adhered to the base substrate 12 via an adhesive (not shown.) The material of the reinforcing member 20 is not limited to any particular material, and the same material as that of the base substrate 12, for example, may be used. Further, the outer configuration and thickness of the reinforcing member 20 are not limited to any particular configuration and thickness, either.

The wiring substrate 10 may have a semiconductor chip 11 mounted thereon (see FIG. 1.) In this case, the cutting process as will be described hereinafter may be carried out with the semiconductor chip 11 being mounted thereon. Further, the semiconductor chip 11 may be mounted so as to be electrically connected to the wires 50 or not to be electrically connected to the wires 50.

Figure 4:
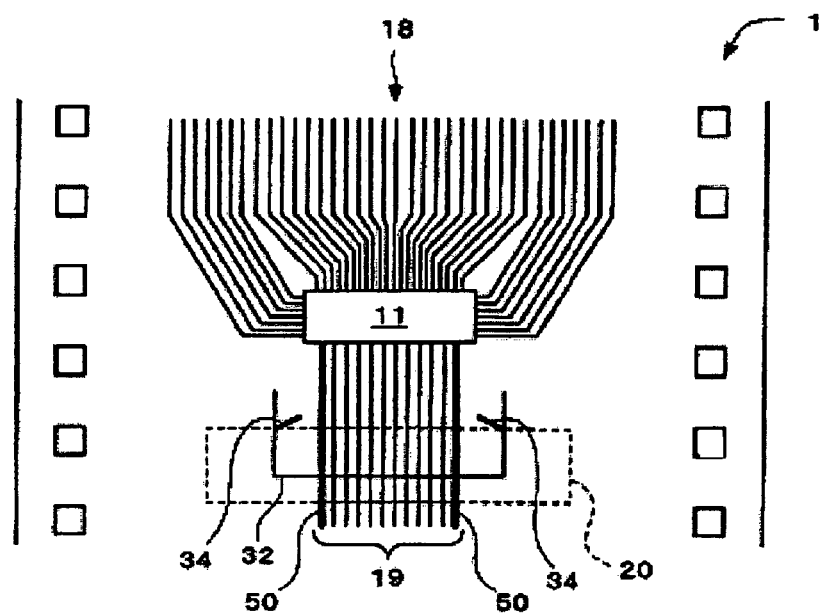
FIG. 4 is a diagram to explain the method for manufacturing the electronic part of the first embodiment applying the invention.

The method for manufacturing the electronic part of the embodiment includes conducting the cutting process on the wiring substrate 10 by cutting the wiring substrate 10 along the line 30 as shown in FIG. 3. The cutting process may be a shearing process. Further, the cutting process may be conducted on the substrate 10 by placing and pressing a blade of a Thomson die, a sculpture die, a pinnacle die, or the like on the substrate 10 to cut the substrate 10. The line 30 is a line that intersects with the outer circumference of the reinforcing member 20. Further, the intersecting point of the outer circumference of the reinforcing member 20 and the line 30 may be referred to as the intersecting point 31 (see FIG. 3.) In this manufacturing process, as shown in FIG. 4, a cut line 32 can be formed in the base substrate 12. That is, by this manufacturing process, an electronic part 1 as shown in FIG. 4 may be manufactured. As described hereinbefore, because the wiring substrate 10 includes the reinforcing member 20, there is a large difference in thickness of the wiring substrate 10 between a portion overlapping with the reinforcing member 20 of the wiring substrate 10 and a region outside the reinforcing member 20 of the wiring substrate 10 (see FIG. 2.) When cutting a wiring substrate having regions with different thicknesses, the base substrate 12 tends to be stretched by a cutting jig, and pressure tends to be applied to the base substrate 12. In particular, when successively cutting the region that overlaps with the reinforcing member 20 and the region outside thereof, the pressure tends to be applied to the base substrate 12. As a result, as shown in FIG. 4, cracks 34 tend to occur in the base substrate 12. That is to say that, in this manufacturing process, the cracks 34 may be formed in the base substrate 12. In other words, the cutting process may be conducted in a manner that the cracks 34 occur in the base substrate 12. Now, in the embodiment, as described hereinbefore, the wiring pattern 18 includes the wires 50. Since the wires 50 are arranged closest to the intersecting points 31, it is possible to prevent the cracks 34 from extending farther than the wires 50. Further, since the wires 50 have the largest width, they can prevent disconnection of the wires 50 caused by the cracks 34. Therefore, according to the present method, the electrically highly reliable electronic part can be manufactured. In addition, a distance from the intersecting point 31 of the outer circumference of the reinforcing member 20 and the line 30 to the wiring pattern 18 (the wires 50) may be greater than the total thickness of the base substrate 12 and the reinforcing member 20. Although the cracks 34 tend to occur from the intersecting point 31, it is possible to prevent the cracks 34 from reaching to the wiring pattern 18 by making the distance from the intersecting point 31 to the wiring pattern 18 (the wires 50) to be greater than a fixed distance. Further, in the cutting process, there is a case in which the cracks having the same length as the total thickness of the base substrate 12 and the reinforcing member 20 occur. Therefore, by making the distance from the intersecting point 31 to the wiring pattern 18 greater than the total thickness of the base substrate 12 and the reinforcing member 20, it is possible to prevent the cracks 34 from breaking the wiring pattern 18 during the cutting process, and the highly reliable electronic part can be manufactured. The line 30 may be a line having both ends. That is, in this manufacturing process, the cut line 32 may be made in the wiring substrate 10, as shown in FIG. 4, without die-cutting the wiring substrate 10. Accordingly, the wiring substrate 10 can be handled in a form of tape, and it is also possible to efficiently carry out the following processes.

Figure 5:
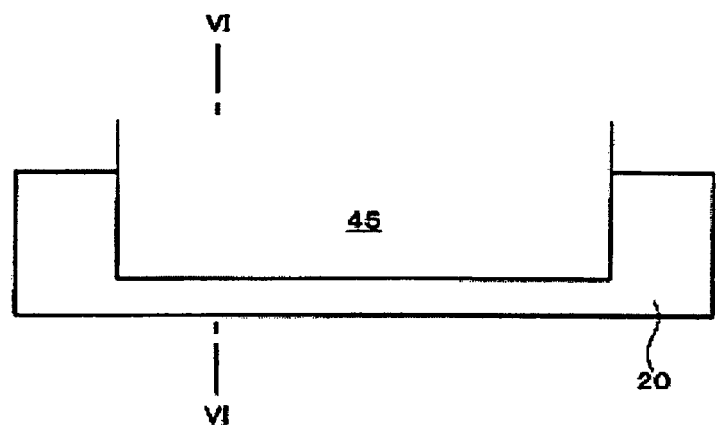
FIG. 5 is a diagram to explain the method for manufacturing the electronic part of the first embodiment applying the invention.
Figure 6:
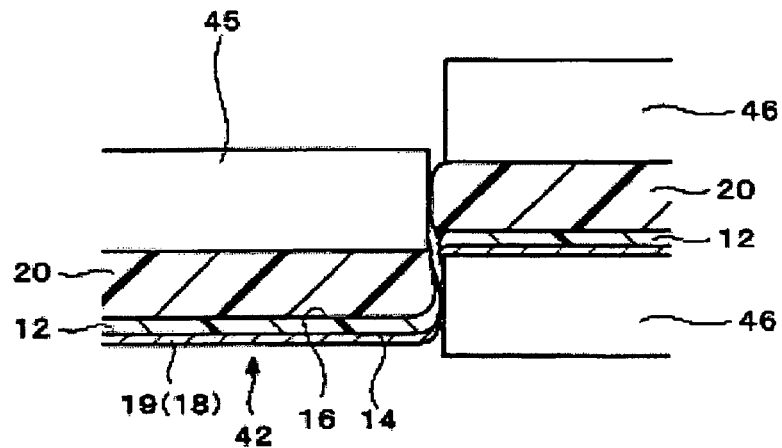
FIG. 6 is a diagram to explain the method for manufacturing the electronic part of the first embodiment applying the invention.

As shown in FIG. 3, the line 30 may intersect with the wires 19 within the region overlapping with the reinforcing member 20. In this case, the wires 19 may be cut by the cutting process. As shown in FIGS. 5 and 6, this manufacturing process may include pressing a region 42, which is surrounded by sides of the reinforcing member 20 intersecting with the lines 30 and the lines 30, from the side of the second surface 16 using a shearing jig 45. As shown in FIG. 6, the shearing process may be carried out while holding a region outside the region 42 with a shearing jig 46. Further, the region 42 is a region that becomes the terminal portion 48 of the electronic part (the electronic part 2 as will be described) die-cut from the wiring substrate 10. By this method, as shown in FIG. 6, the wires 19 within the region 42 are cut while being pressed onto the base substrate 12. This can make it difficult for the wires 19 to peel off from the base substrate 12 at the end part of the terminal portion 48. As a consequence, the highly reliable electronic part can be produced. Additionally, FIGS. 5 and 6 are diagrams to explain the process of shearing the wiring substrate 10. Here, FIG. 6 is a partially enlarged diagram of FIG. 5 taken across a line VI-VI. Further, in FIG. 5, the shearing jig 46 is omitted.

Figure 7:
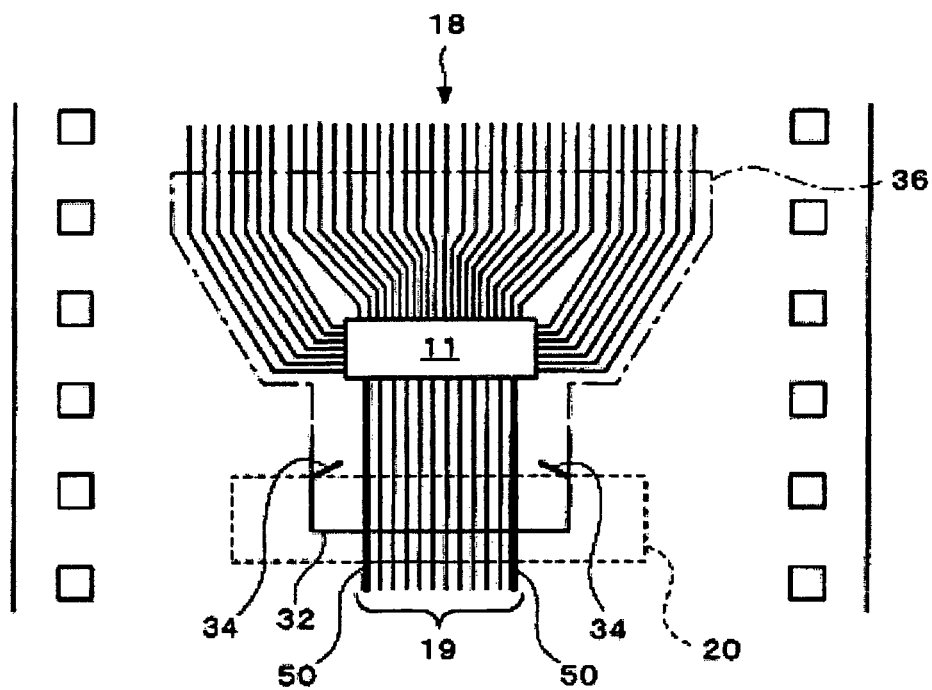
FIG. 7 is a diagram to explain the method for manufacturing the electronic part of the first embodiment applying the invention.
Figure 8:
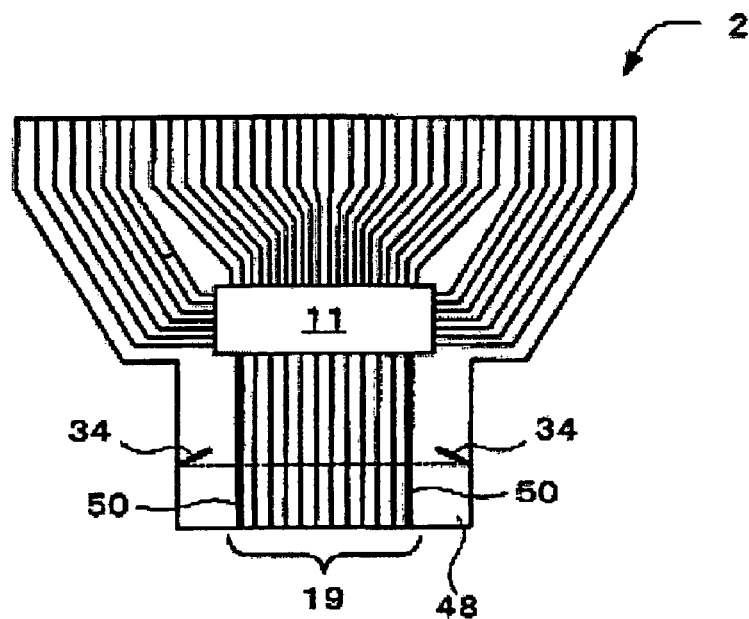
FIG. 8 is a diagram to explain the method for manufacturing the electronic part of the first embodiment applying the invention.
Figure 9:
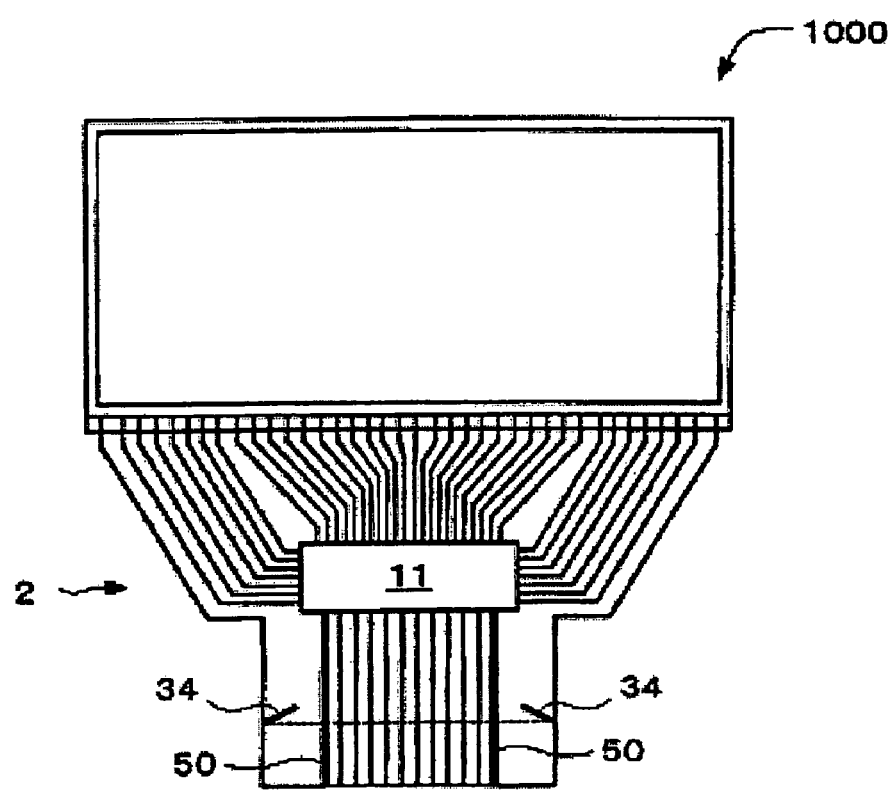
FIG. 9 is a diagram of an electronic module having the electronic part manufactured by the method of the embodiment applying the invention.
Figure 10:
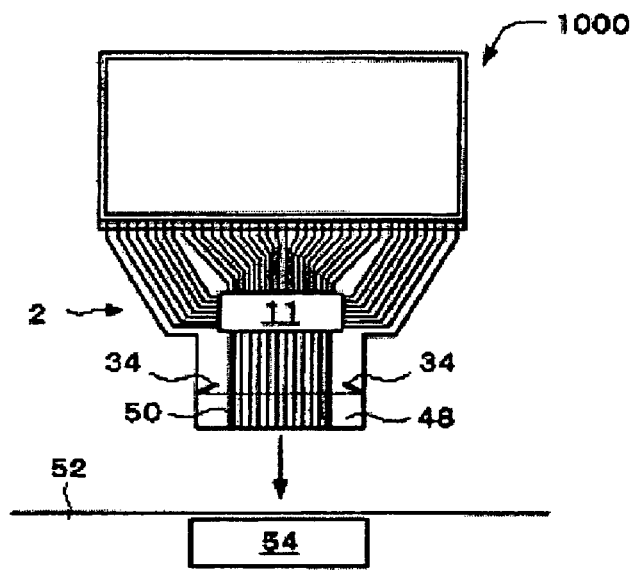
FIGS. 10(A) and 10(B) are diagrams to explain how to connect the electronic part manufactured by the method of the embodiment applying the invention to a circuit board.
Figure 10:
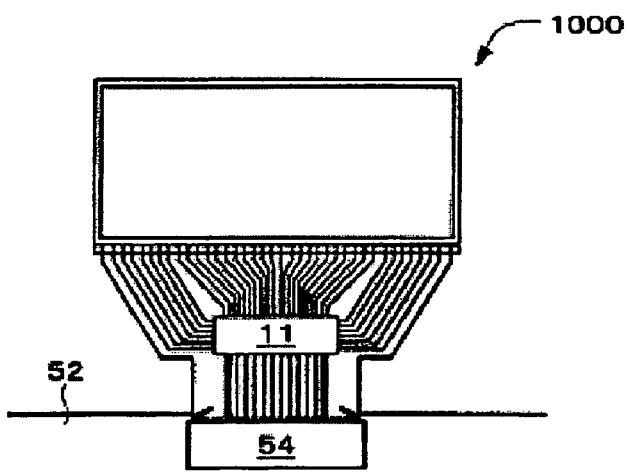
Figure 11:
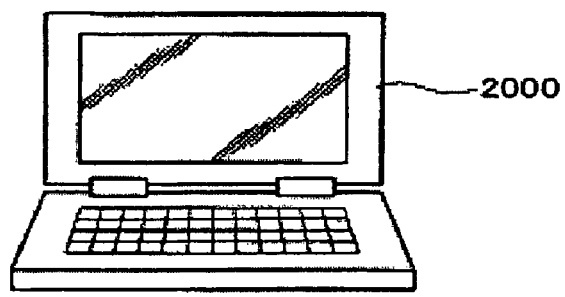
FIG. 11 is a diagram to explain an electronic apparatus containing the electronic part manufactured by the method of the embodiment applying the invention.
Figure 12:
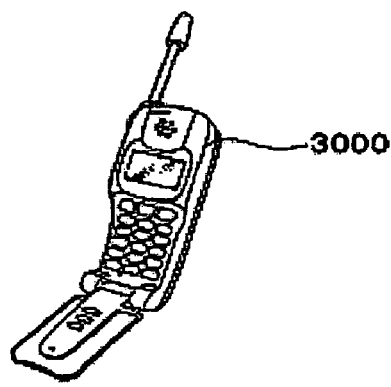
FIG. 12 is a diagram to explain an electronic apparatus containing the electronic part manufactured by the method of the embodiment applying the invention.

The method for manufacturing the electronic part of the embodiment may further include die-cutting a portion of the electronic part 1. The electronic part 1 may be cut, and a portion thereof may be die-cut. In this case, the portion of the electronic part 1 may be die-cut along a line 36 shown in FIG. 7. The line 36 may extend to join the cut line 32 as shown in FIG. 7. By this manufacturing process, the electronic part 2 shown in FIG. 8 may be manufactured. In the preceding process, the wiring substrate 10 is cut along the line 30. Further, since the line 30 intersects with the outer circumference of the reinforcing member 20, there is no need to cut the region having difference thicknesses in this process. Accordingly, when die-cutting the electronic part 1, it is possible to prevent the cracks from occurring further in the base substrate 12, and the highly reliable electronic part can be manufactured. The electronic part 2 includes the base substrate 12. The base substrate 12 contains the cracks 34. The electronic part 2 contains the wiring pattern 18 provided on the first surface 14 of the base substrate 12. The electronic part 2 contains the reinforcing member 20 provided on the second surface 16 of the base substrate 12. The wiring pattern 18 contains the plurality of wires 19 that pass through the region overlapping with the reinforcing member 20. Further, the outermost wires (the wires 50) of the wires 19 have the largest width. Consequently, it is possible to provide the highly reliable electronic part in that the wires 50 can prevent the cracks 34 from progressing. Furthermore, since the base substrate 12 includes the cracks 34, stress can be concentrated on the cracks 34. Accordingly, it is possible to provide the highly reliable electronic part since an area other than the cracks 34 is less likely to receive stress. Moreover, it can be said that the wires 50 are the least likely to break because they have the largest width. Accordingly, it is possible to provide the highly reliable electronic part, in which the wires do not easily break. In addition, the semiconductor chip 11 may be mounted on the electronic part 2. In this case, the electronic part 2 may be called a semiconductor device. The wires 50 may be electrically connected to the semiconductor chip 11 or may be electrically not connected to the semiconductor chip 11. The semiconductor chip 11 may be mounted on the wiring substrate 10, and, in this case, the cutting process as described above may be conducted to the wiring substrate having the semiconductor chip 11 mounted thereon. However, apart from this, the semiconductor chip 11 may be mounted after the cutting process is conducted. In this case, the above-described cutting process may be carried out (not shown) on the wiring substrate 10 not having the semiconductor chip. Further, FIG. 9 shows an electronic module 1000 having the electronic part 2. The electronic module 1000 may be a display device. The display device may be a liquid-crystal display device or an electrical luminescence (EL) display device, for example. The electronic module 1000 can be electrically connected to a circuit board 52 using the terminal portion 48 as shown in FIGS. 10(A) and 10(B). In this case, as shown in FIGS. 10(A) and 10(B), the electronic module 1000 and the circuit board may be electrically and physically connected by insertion of the terminal portion 48 into a connector 54 of the circuit board 52. As described hereinbefore, because the terminal portion 48 includes the reinforcing member 20, it can easily be inserted into the connector 54. In addition, as the electronic devices having the electronic part 2, FIG. 11 shows a notebook-type personal computer 2000, and FIG. 12 shows a cellular phone 3000.

First Modified Example

Figure 13:
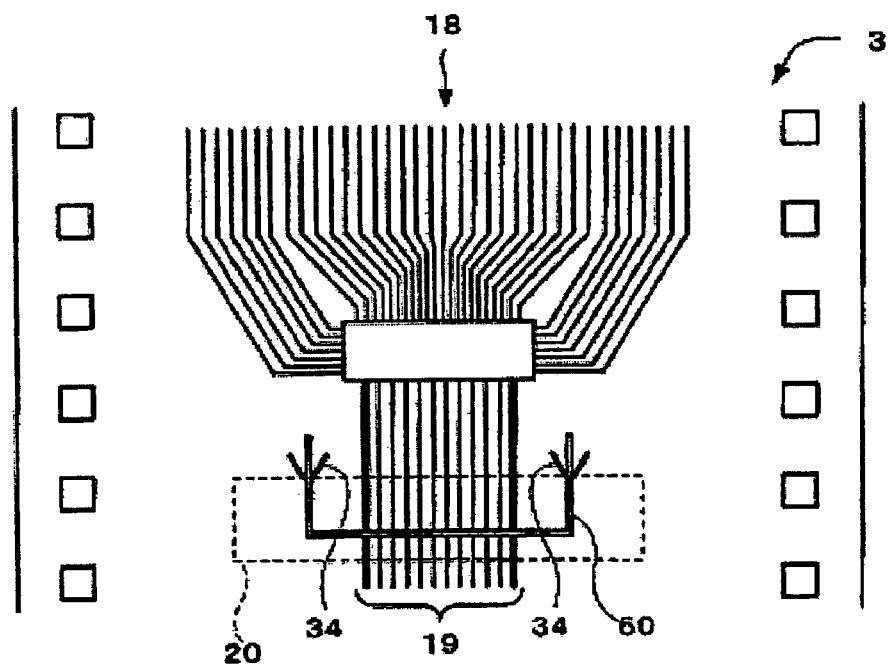
FIG. 13 is a diagram to explain a method for manufacturing an electronic part of a first modified example of the first embodiment applying the invention.

FIG. 13 is a diagram to explain the method for manufacturing the electronic part of the first modified example of the first embodiment applying the invention.

The method for manufacturing the electronic part of the embodiment includes carrying out the cutting process on the wiring substrate 10 by forming an opening 60 that extends along the line 30 on the wiring substrate 10, as shown in FIG. 13. The cutting process may be the shearing process. Further, the cutting process may be conducted on the substrate 10 by putting and pressing the blade of the Thomson die, sculpture die, pinnacle die, or the like to cut the substrate 10. If the line 30 intersects with the wires 19 (see FIG. 3), this manufacturing process may include pressing a region on the wiring substrate 10 where the opening 60 is formed from the side of the first surface 14. As a consequence, the highly reliable electronic part in which the wires 19 do not easily peel off can be manufactured. In this case, the cutting process may be carried out by pressing the wiring substrate 10 from the side of the first surface 14 with a cutting jig whose tip surface has the same configuration as that of the opening 60. By this manufacturing process, an electronic part 3 as shown in FIG. 13 may be produced.

The method for manufacturing the electronic part of the embodiment may further include carrying out the cutting process on the electronic part 3 by die-cutting a portion from the electronic part 3. In this case, the portion of the electronic part 3 may be die-cut along a line (not shown) linking to the opening 60. The electronic part 2 may be manufactured by die-cutting the portion of the electronic part 3 (see FIG. 8).

Second Modified Example

Figure 14:
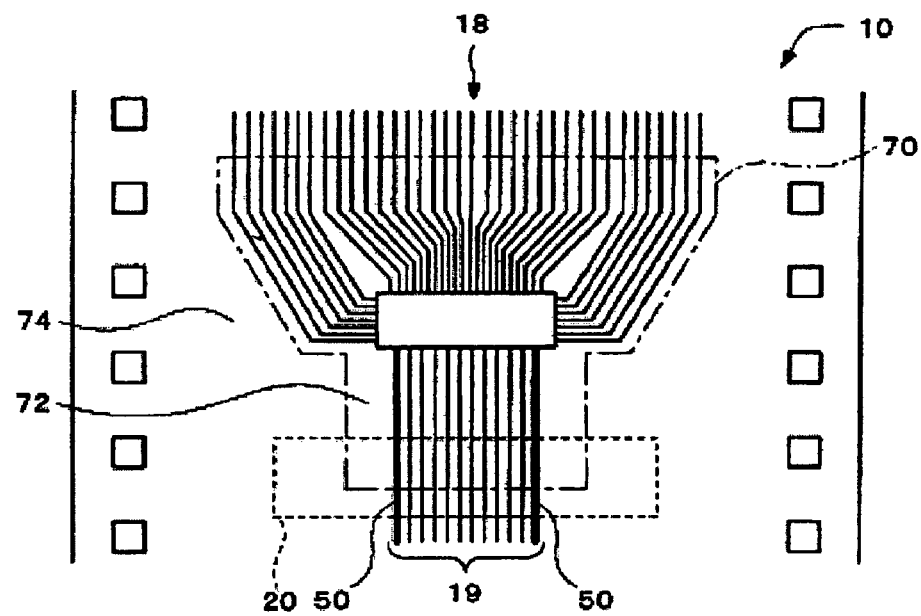
FIG. 14 is a diagram to explain a method for manufacturing an electronic part of a second modified example of the first embodiment applying the invention.

FIG. 14 is a diagram to explain the method for manufacturing the electronic part of the second modified example of the first embodiment applying the invention.

The method for manufacturing the electronic part of the embodiment includes conducting the cutting process on the wiring substrate 10 by cutting the wiring substrate 10 along a line 70. The cutting process may be the shearing process. Further, the cutting process may be conducted on the substrate 10 by placing and pressing the blade of the Thomson die, sculpture die, pinnacle die, or the like on the substrate 10 to cut the substrate 10. As shown in FIG. 14, the line 70 is a line that intersects with the outer circumference of the reinforcing member 20. The wiring substrate 10 includes a first portion 72 surrounded by the line 70 and a second portion 74 outside the line 70. That is, it can be said that the line 70 is an encompassing line surrounding the first portion 72. By this manufacturing process, the first portion 72 is die-cut from the wiring substrate 10. Accordingly, the electronic part 2 (see FIG. 8) may be manufactured. This manufacturing process may include pressing the first portion 72 from the side of the second surface 16 by use of the cutting jig. In this case, the first portion 72 may be pressed from the side of the second surface 16 using the cutting jig whose tip surface has the same configuration as that of the first portion 72. By pressing the first portion 72 from the side of the second surface 16, the highly reliable electronic part in which the wires 19 do not easily peel off can be manufactured.

Second Embodiment

Figure 15:
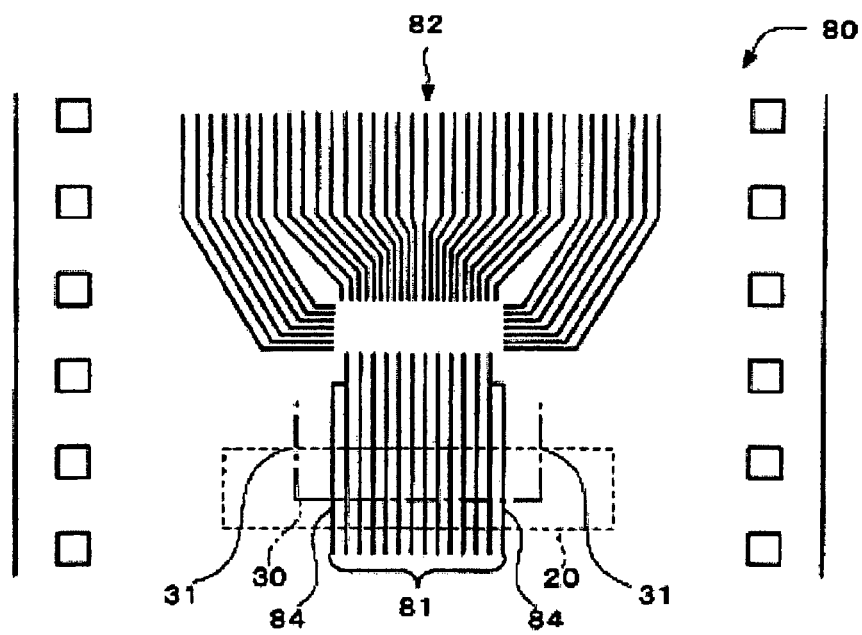
FIG. 15 is a diagram to explain a method for manufacturing an electronic part of a second embodiment applying the invention.
Figure 16:
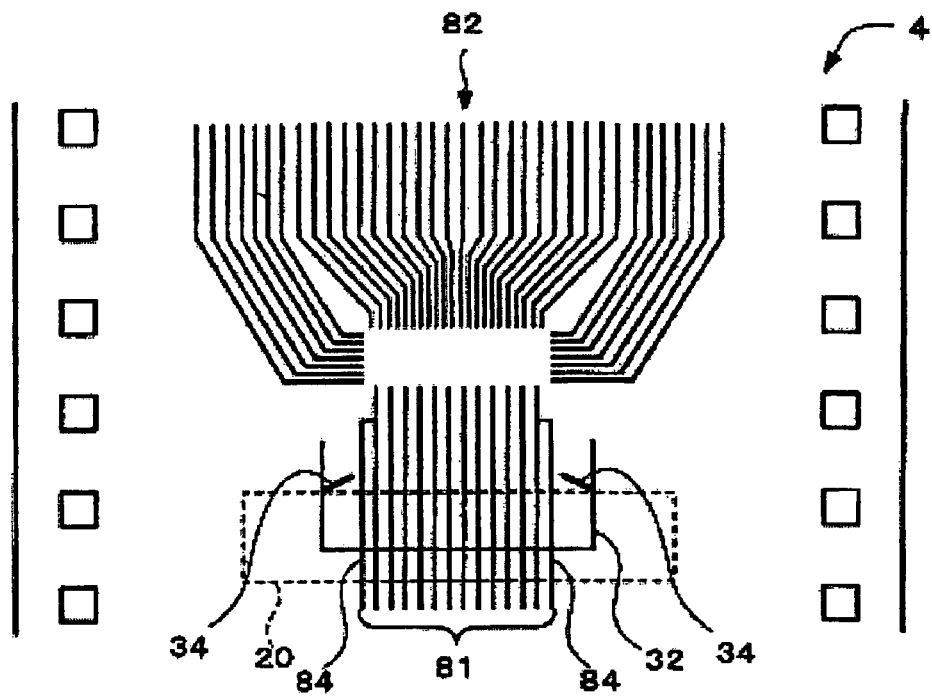
FIG. 16 is a diagram to explain the method for manufacturing the electronic part of the second embodiment applying the invention.
Figure 17:
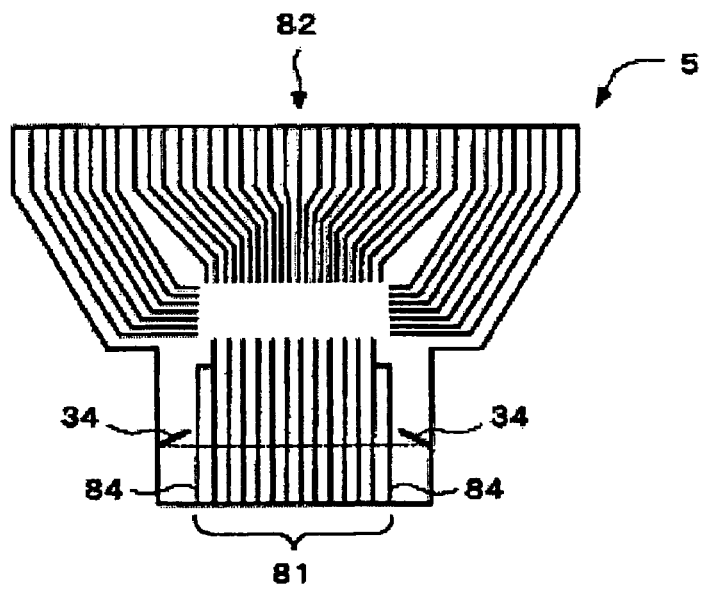
FIG. 17 is a diagram to explain the method for manufacturing the electronic part of the second embodiment applying the invention.

FIGS. 15 to 17 are diagrams to explain the method for manufacturing the electronic part of the second embodiment applying the invention.

The method for manufacturing the electronic part of the present embodiment may include preparing a wiring substrate 80 as shown in FIG. 15. The wiring substrate 80 includes a wiring pattern 82. The wiring pattern 82 is provided on the first surface 14 of the base substrate 12. The wiring substrate 80 contains the reinforcing member 20. The reinforcing member 20 is provided on the second surface 16 of the base substrate 12. Further, of the plurality of wires composing the wiring pattern 82, wires 84 arranged closest to the intersecting point 31 of the outer circumference of the reinforcing member 20 and the line 30 are wires diverged from wires 81 that pass through the region overlapping with the reinforcing member 20.

The method for manufacturing the electronic part of the embodiment includes conducting the cutting process on the wiring substrate 80 by cutting the wiring substrate 80 along the line 30. The cutting process may be the shearing process. Further, the cutting process may be conducted on the substrate 10 by placing and pressing the blade of the Thomson die, sculpture die, pinnacle die, or the like on the substrate 10 to cut the substrate 10. In this manufacturing process, the cut line 32 may be formed on the base substrate 12 as shown in FIG. 16. Further, by this process, the cracks 34 may be formed in the base substrate 12. Consequently, an electronic part 4 as shown in FIG. 16 may be manufactured. Accordingly, the cracks 34 that occur during the cutting process can be stopped by the wires 84. In addition, since the wires 84 are the wires diverged from the wires 81, it is possible to secure detouring signal lines even when there is a trouble with the wires 84. Thus, the highly reliable electronic part can be manufactured.

The method for manufacturing the electronic part of the embodiment may further include die-cutting a portion of the wiring substrate 80. Consequently, an electronic part 5 as shown in FIG. 17 may be manufactured. The electronic part 5 contains the base substrate 12 having the cracks 34. The electronic part 5 contains the wiring pattern 82 provided on the first surface 14 of the base substrate 12. The electronic part 5 contains the reinforcing member 20 provided on the second surface 16 of the base substrate 12. Further, the wiring pattern 82 contains a plurality of wires 81 that pass through the region overlapping with the reinforcing member 20. The outermost wires (the wires 84) of the wires 81 are diverged from the rest of the wires 81. According to the electronic part 5, the stress is concentrated on the cracks 34 because the base substrate 12 includes the cracks 34. However, it is possible to prevent the cracks 34 from progressing with the outermost wires (the wires 84) of the wires 81. In addition, since the wires 84 are the wires diverged from the rest of the wires 81, it is possible to keep the detouring signal lines even when a trouble occurs in the wires due to the cracks 34. As a consequence, according to the electronic part 5, it is possible to prevent the electronic part from becoming electrically less reliable due to the cracks 34.

Third Embodiment

Figure 18:
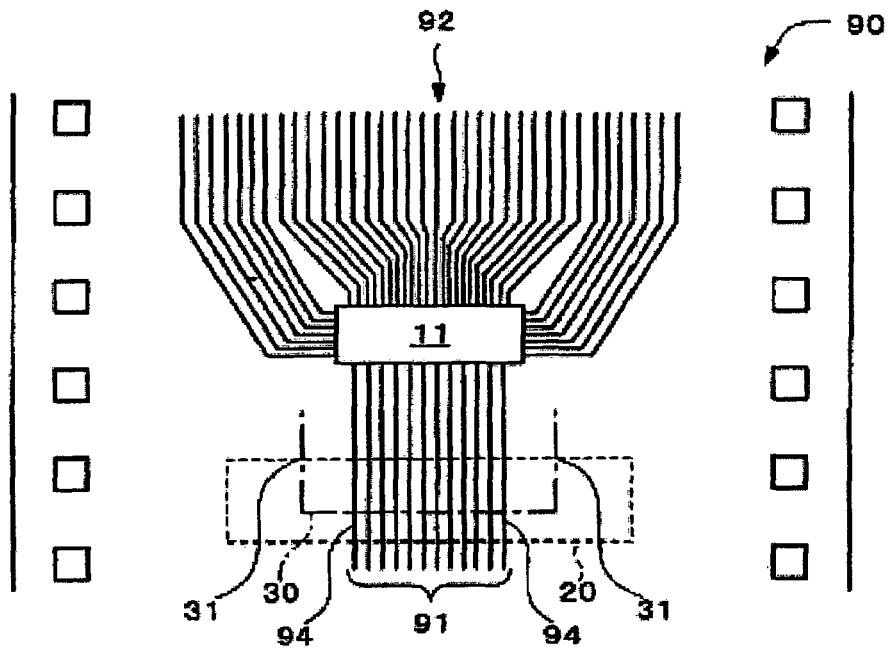
FIG. 18 is a diagram to explain a method for manufacturing an electronic part of a third embodiment applying the invention.
Figure 19:
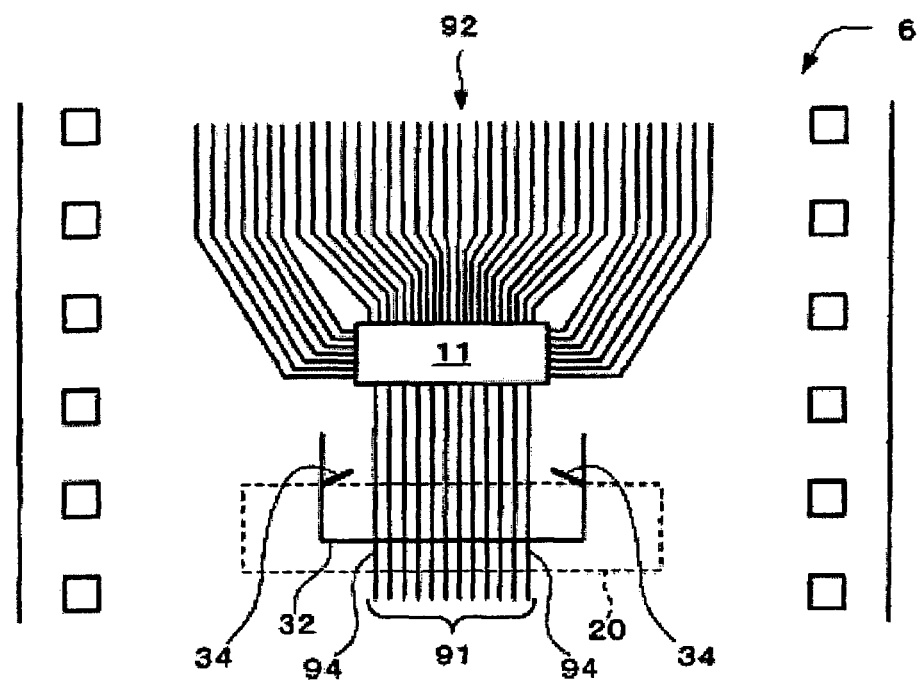
FIG. 19 is a diagram to explain the method for manufacturing the electronic part of the third embodiment applying the invention.
Figure 20:
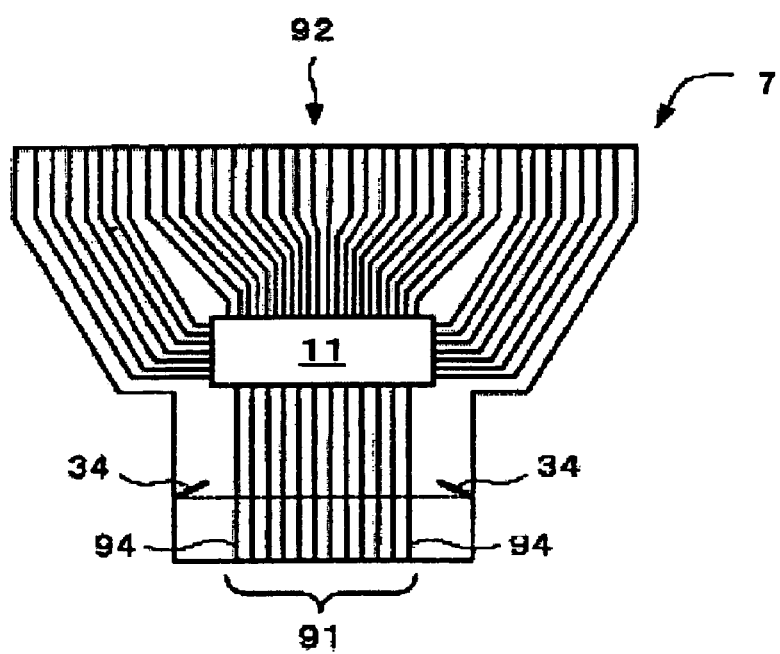
FIG. 20 is a diagram to explain the method for manufacturing the electronic part of the third embodiment applying the invention.

FIGS. 18 to 20 are diagrams to explain the method for manufacturing the electronic part of the third embodiment applying the invention.

The method for manufacturing the electronic part of the embodiment may include preparing a wiring substrate 90 as shown in FIG. 18. The wiring substrate 90 includes a wiring pattern 92. The wiring pattern 92 is provided on the first surface 14 of the base substrate 12. The wiring substrate 90 includes the reinforcing member 20. The reinforcing member 20 is provided on the second surface 16 of the base substrate 12. The wiring substrate 90 has the semiconductor chip 11 mounted thereon. Further, of the plurality of wires composing the wiring pattern 92, wires 94 arranged closest to the intersecting point 31 of the outer circumference of the reinforcing member 20 and the line 30 are the wires not electrically connected to the semiconductor chip 11.

The method for manufacturing the electronic part of the embodiment includes conducting the cutting process on the wiring substrate 90 by cutting the wiring substrate 90 along the line 30. The cutting process may be the shearing process. Further, the cutting process may be conducted on the substrate 10 by placing and pressing the blade of the Thomson die, sculpture die, pinnacle die, or the like on the substrate 10 to cut the substrate 10. In this manufacturing process, the cut line 32 may be formed on the base substrate 12. Further, in this process, the cracks 34 may be formed in the base substrate 12. Consequently, an electronic part 6 as shown in FIG. 19 may be manufactured. Accordingly, the cracks 34 that occur during the cutting process can be stopped by the wires 94. In addition, since the wires 94 are the wired not electrically connected to the semiconductor chip 11, it is possible to maintain the electrical reliability of the electronic part even when there is a trouble with the wires 94.

The method for manufacturing the electronic part of the embodiment may further include die-cutting a portion of the wiring substrate 90. Consequently, an electronic part 7 as shown in FIG. 20 may be manufactured. The electronic part 7 contains the wiring substrate. The wiring substrate contains the base substrate 12 having the cracks 34. The wiring substrate contains the wiring pattern 92 provided on the first surface 14 of the base substrate 12. The wiring substrate contains the reinforcing member 20 provided on the second surface 16 of the base substrate 12. The electronic part 7 contains the semiconductor chip 11 mounted on the wiring substrate. Further, the wiring pattern 92 contains a plurality of wires 91 that pass through the region overlapping with the reinforcing member 20. The outermost wires (the wires 94) of the wires 91 are the wires not electrically connected to the semiconductor chip 11. According to the electronic part 7, the stress is concentrated on the cracks 34 since the base substrate 12 includes the cracks 34. However, it is possible to prevent the cracks 34 from progressing because of the presence of the outermost wires (the wires 94). In addition, since the wires 94 are not electrically connected to the semiconductor chip 11, it is possible to prevent the decrease in the electric reliability even when there is a trouble with the wires 94. As a consequence, according to the electronic part 7, it is possible to prevent the decrease in the electric reliability caused by the cracks 34.

Additionally, the invention is not limited to the described embodiments, but various modifications are possible. For example, the invention includes essentially the same structure (e.g., the structure having the same functions, methods, and results or the structure having the same objectives and effects) as the one described in the embodiments. Further, the invention includes a structure substituting unessential parts of the structure described in the embodiments. Moreover, the invention includes a structure in which the same effects can be exerted or the same objectives can be reached as those in the structure described in the embodiments. In addition, the invention includes well-known techniques added to the structure described in the embodiments of the invention.

What is claimed is:

1. A method for manufacturing an electronic part, comprising:
   cutting a wiring substrate along a line intersecting with an outer circumference of a reinforcing member, the wiring substrate including a base substrate, a wiring pattern provided on a first surface of the base substrate, and the reinforcing member provided on a second surface of the base substrate;
   wherein a wire, out of a plurality of wires composing the wiring pattern, arranged closest to an intersecting point of the outer circumference of the reinforcing member and the line has a widest width.

2. The method for manufacturing the electronic part according to claim 1, wherein a distance from the intersecting point to the wiring pattern is greater than a total thickness of the base substrate and the reinforcing member.

3. The method for manufacturing the electronic part according to claim 1, wherein the process of cutting the wiring substrate includes pressing a region surrounded by sides of the reinforcing member intersecting with the lines and the lines from a side of the second surface.

* * * * *